(12) United States Patent
Bello, II

(10) Patent No.: US 12,398,467 B2
(45) Date of Patent: Aug. 26, 2025

(54) APPARATUS FOR DEPOSITION OF GRAPHENE UPON A METAL SUBSTRATE AND METHOD FOR DOING SO

(71) Applicant: Gerard Bello, II, Louisville, KY (US)

(72) Inventor: Gerard Bello, II, Louisville, KY (US)

( * ) Notice: Subject to any disclaimer, the term of this patent is extended or adjusted under 35 U.S.C. 154(b) by 629 days.

(21) Appl. No.: 17/729,409

(22) Filed: Apr. 26, 2022

(65) Prior Publication Data
US 2023/0340671 A1    Oct. 26, 2023

(51) Int. Cl.
| | |
|---|---|
| C23C 16/54 | (2006.01) |
| C23C 16/26 | (2006.01) |
| C23C 16/50 | (2006.01) |
| C25B 1/135 | (2021.01) |
| C25B 9/05 | (2021.01) |
| C25B 11/033 | (2021.01) |
| C25B 11/065 | (2021.01) |
| C25B 11/089 | (2021.01) |
| C25D 13/02 | (2006.01) |
| C25D 13/16 | (2006.01) |

(52) U.S. Cl.
CPC .......... *C23C 16/545* (2013.01); *C23C 16/26* (2013.01); *C23C 16/50* (2013.01); *C25B 1/135* (2021.01); *C25B 9/05* (2021.01); *C25B 11/033* (2021.01); *C25B 11/065* (2021.01); *C25B 11/089* (2021.01); *C25D 13/02* (2013.01); *C25D 13/16* (2013.01)

(58) Field of Classification Search
None
See application file for complete search history.

(56) References Cited

U.S. PATENT DOCUMENTS

| | | | | |
|---|---|---|---|---|
| 3,607,678 A | * | 9/1971 | Wise | ...................... C25D 17/20 |
| | | | | 205/333 |
| 2013/0140058 A1 | | 6/2013 | Kim et al. | |
| 2014/0323596 A1 | | 10/2014 | Jeong et al. | |
| 2015/0315398 A1 | | 11/2015 | Hersam et al. | |
| 2024/0044018 A1 | * | 2/2024 | Zavabeti | ................. C25B 1/135 |

FOREIGN PATENT DOCUMENTS

| | | | | |
|---|---|---|---|---|
| CN | 106283150 A | | 1/2017 | |
| GB | 2617144 A | * | 10/2023 | ............... C25D 1/00 |
| WO | PCT/JP2017/016998 | | 11/2017 | |

OTHER PUBLICATIONS

Trademark Registration of "Galistan" retrieved via uspto.gov website (Year: 2024).*
Handschuh-Wang, Stephan, Tiansheng Gan, Muhammad Rauf, Weifa Yang, Florian J. Stadler, and Xuechang Zhou. "The subtle difference between Galinstan (R) and eutectic GaInSn." Materialia 26 (2022): 101642. (Year: 2022).*

* cited by examiner

Primary Examiner — Louis J Rufo
(74) Attorney, Agent, or Firm — H. Jay Spiegel

(57) ABSTRACT

An industrial process is conducted within a sealed chamber filled with dimethylformamide (DMF) saturated with $CO_2$ under pressure which provides the carbon atoms for manufacturing graphene. A copper wire comprising an anode is reeled between two spaced reels on opposite sides of the sealed chamber, preferably above and below a container within the chamber. Electrical voltage is supplied to a graphite and Galinstan-Cerium electrode which acts as a cathode and during the process a chemical reaction is induced between the Galinstan-Cerium electrode and the $CO_2$ saturated DMF liquid so that graphene is deposited on the copper wire which acts as an anode.

17 Claims, 7 Drawing Sheets

APPARATUS FOR DEPOSITION OF GRAPHENE UPON A METAL SUBSTRATE AND METHOD FOR DOING SO

BACKGROUND OF THE INVENTION

The present invention relates to an apparatus for deposition of graphene upon a metal substrate and method for doing so.

Graphene is an allotrope of carbon consisting of a single layer of atoms arranged in a two-dimensional honeycomb lattice nanostructure. The term "graphene" is derived from the word "graphite" and the suffix "ene" reflecting the fact that the graphite allotrope of carbon contains numerous double bonds. Graphene was first discovered around 60 years ago but only decades later was it investigated for its properties. Investigation found that graphene has high tensile strength, high electrical conductivity and transparency, and is the thinnest two-dimensional material known today. Graphene has industrial uses in the manufacture of semiconductors, electrical batteries, various composites, and electronics.

An article titled "Room temperature $CO_2$ reduction to solid carbon species on liquid metals featuring atomically thin ceria interfaces" by Esrafilzadeh et al. (2019) discusses obtaining an amorphous species of Carbon from $CO_2$ gas. However, this article fails to teach or suggest any reproducible industrial process for obtaining graphene in a usable manner. The authors describe creation of an amorphous species of Carbon on the surface of a liquid metal alloy held aloft by capillary action. Such a process makes it impractical to recover graphene.

Graphene has been found to be a difficult substance to derive from carbon material but due to its superior and unique qualities in terms of electrical conductivity and hardness, it is a worthwhile exercise to seek an industrial process that can be used to create graphene. Currently, expensive processes such as chemical vapor deposition or exfoliation of graphite have been employed to produce graphene. These processes require multiple steps which increase the costs of production dramatically and can be done in a laboratory setting but are financially impractical in an industrial environment. If those multiple steps could be omitted and graphene could be derived in a more simple manner, it would become feasible to produce graphene on an industrial scale for various end uses such as, for example, coating electrically conductive wires and coating flat or three-dimensional substrates.

A material coated with graphene has reduced susceptibility to corrosion. Graphene can also create hardened low friction corrosion free metal surfaces for use in kitchen devices, medical fields, and various types of machinery. Graphene and encased wires exhibit vastly reduced resistance to flow of electricity which facilitates greater current density for a wire as compared to a wire not coated with graphene. Wire traces on a circuit board coated with graphene can eliminate the use of gold alloys and thereby reduce the cost of circuit boards.

The following prior art is known to Applicant:

U.S. Published Application No. US 2015/0315398 A1 to Hersam et al. discloses methods for preparation of concentrated graphene compositions and related composite materials. The present invention differs from the teachings of Hersam et al. because Hersam et al. employ an exfoliation method, they do not create graphene on a final medium, their process is just chemical in nature not electrochemical, and it does not make use of a liquid metal or electricity.

Published PCT Application No. PCT/JP2017/016998 discloses a method for making graphene. The present invention differs from the teachings of this published PCT application because in it, the precursor gas CO or $CO_2$ is generated during a reaction from a precursor and not added directly in saturation, the electrode employed is aluminum carbide, a liquid metal is not employed, and the solvent that is employed is a reactant not a catalyst.

U.S. Published Application No. US 2014/0323596 A1 to Jeong et al. discloses graphene oxide reduced material dispersed at high concentration by cation-II interaction and method of manufacturing same. The present invention differs from the teachings of this published application because the present invention contemplates manufacture of graphene not graphene oxide, the process in the published application involves use of an alkali solvent, the disclosed process does not use electricity nor does it use a liquid metal and it does not create graphene on a substrate which will be directly used in a manufactured item. Additionally, the method disclosed in this published application only makes flakes of graphene oxide not continuous sheets or wire coatings, nor does it facilitate deposition of graphene in a usable form upon a substrate.

Chinese Published Application No. CN 2013101259127A filed by Xian Jiaotong University for graphene-coated copper welding wire for electronic packaging and preparation method for graphene-coated copper welding wire. The present invention differs from the teachings of this Chinese published application because Applicant does not contemplate manufacture of welding wire, the disclosed process is a high temperature process conducted above 850° C., much higher than the temperature range employed in the present invention, no liquid metal is employed, no solvent is used, and the disclosed process is a gas-based process not a wet process.

U.S. Published Application No. US 2013/0140058 A1 to Kim et al. discloses graphene electrical wire and a method for manufacturing thereof. The present invention differs from the teachings of this published application because the published application discloses a process that is only effective where the wire is made of copper, nickel, and ruthenium, the graphene disclosed is manufactured by either exfoliation or carbon vapor deposition, no liquid metal alloy is employed as a catalyst, and no solvent is employed.

Chinese Published Application No. CN 201510236704.3A, filed by Shenzhen Zhong Yuzhao Science and Technology Ltd, discloses a kind of electrodeposition graphene conductive corrosion-resistant material preparation method for the material. The present invention differs from the teachings of this published application because the published application discloses use of graphene oxide as a source material, the process does not make graphene, the process employs ionized water which is not employed in the present invention, the process requires use of ultrasound, and there is no liquid metal used.

Published PCT Application No. WO2017039055A1 discloses graphene composite metal wire and method for manufacturing same. The present invention differs from the teachings of this published PCT application because the disclosed process uses a copper-iron alloy wire, the process employs microwave radiation, a solvent that is employed is a source of carbon not a catalyst, there is no liquid metal and no direct voltage is employed.

SUMMARY OF THE INVENTION

The present invention relates to an apparatus for deposition of graphene upon a metal substrate and method for doing so. The present invention includes the following interrelated objects, aspects, and features:

(1) In a first aspect, the present invention contemplates an industrial process conducted within a sealed chamber filled with dimethylformamide (DMF). DMF is an organic compound having the chemical formula $(CH_3)_2NC(O)H$. DMF is a colorless liquid miscible with water and most organic liquids. DMF is a common solvent used to facilitate chemical reactions and is odorless.

(2) The chamber containing DMF also has a pressurized $CO_2$ atmosphere which provides the carbon atoms for manufacturing graphene. The atmosphere is preferably pressurized to about 1,500 psi.

(3) In a preferred embodiment, in one example of the teachings in the present invention, a copper wire comprises an anode which is reeled between two spaced reels on opposite sides of the sealed chamber, preferably above and below a container within the chamber.

(4) Electrical voltage is supplied via an electrode to a Galinstan-Cerium electrode which acts as a cathode and during the process a chemical reaction is induced between the Galinstan-Cerium material and the $CO_2$ saturated DMF liquid, whereby graphene is deposited on the copper wire which acts as an anode.

(5) A glass straightener keeps the copper wire isolated from a Galinstan-Cerium cathode which is supplied with electricity via a graphite electrode.

(6) A small gap is formed between the Galinstan-Cerium cathode and the pressurized $CO_2$ gas saturated DMF liquid environment where the graphene is coated onto the wire.

(7) As the copper wire is reeled from one reel to the other through the DMF liquid with the pressurized $CO_2$ adjacent its surface, graphene is created and adheres through capillary action to the nearest point on the copper wire which is moved at a speed corresponding to the rate of deposition of graphene so that a fresh uncoated surface of the wire is always presented as a fresh surface for adherence of graphene.

(8) Motors are provided in sealed housings to rotate the reels to advance the copper wire through the DMF-$CO_2$ area within the sealed chamber.

(9) The apparatus includes a number of valves which supply $CO_2$ and exhaust a mixture of $CO_2$ and $O_2$ to maintain the level of carbon atoms within the sealed chamber at a desired level to keep the DMF saturated with the purest possible $CO_2$, and to facilitate formation of graphene, valves allowing removal and replacement of DMF, a gas exhaust valve, an emergency gas exhaust valve, and a valve allowing natural air or argon (which is an inert gas) to enter the sealed chamber to flush the chamber between sequential operations.

(10) Pressure within the sealed chamber is monitored through the use of sensors and a power supply is provided to provide power for the motors that rotate the reels as well as for the electrodes.

(11) The present invention also contemplates protecting the method of forming graphene upon a metal substrate.

As such, it is a first object of the present invention to provide an apparatus for deposition of graphene upon a metal substrate.

It is a further object of the present invention to provide a method for using the above-mentioned apparatus for depositing graphene upon a metal substrate.

It is a still further object of the present invention to deposit graphene upon a moving copper wire traveling through a sealed chamber.

It is a yet further object of the present invention to provide such an apparatus and method in which the sealed chamber contains DMF and pressurized $CO_2$ which provides the carbon atoms to facilitate deposition of graphene upon a substrate.

It is a still further object of the present invention to provide such an apparatus and method in which a cathode is supplied with electrical voltage and the voltage facilitates deposition on the copper wire acting as an anode.

It is a still further object of the present invention to provide such an apparatus and method in which a source of electrical power is provided to allow operation of the system and practice of the method.

These and other objects, aspects and features of the present invention will be better understood from the following detailed description of the preferred embodiments when read in conjunction with the appended drawing figures.

SPECIFIC DESCRIPTION OF THE PREFERRED EMBODIMENTS

Figure 7:
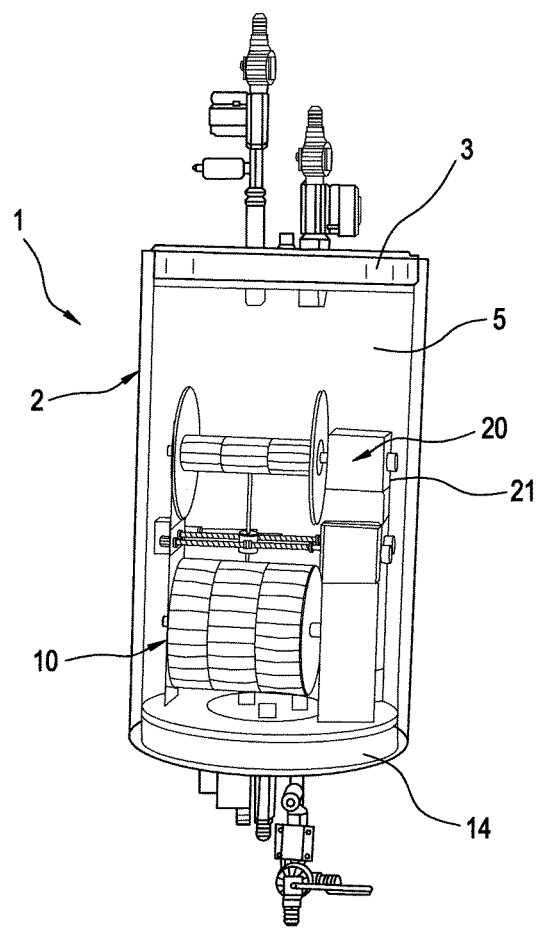
FIG. 7 shows a side view of the inventive apparatus enclosed within a pressure vessel.

Reference is first made to FIG. 7 which shows a pressure vessel or sealed chamber generally designated by the reference numeral 1 and which includes a plurality of ports controlled by valves as will be described in greater detail hereinafter. The pressure vessel is designed to receive a quantity of dimethylformamide (DMF) as well as a quantity of gaseous $CO_2$. The pressure vessel has a peripheral wall 2 and top and bottom covers 3 and 4. It is designed to withstand pressurization of the $CO_2$ to as much as 1,500 psi without bursting or leaking.

Figure 3:
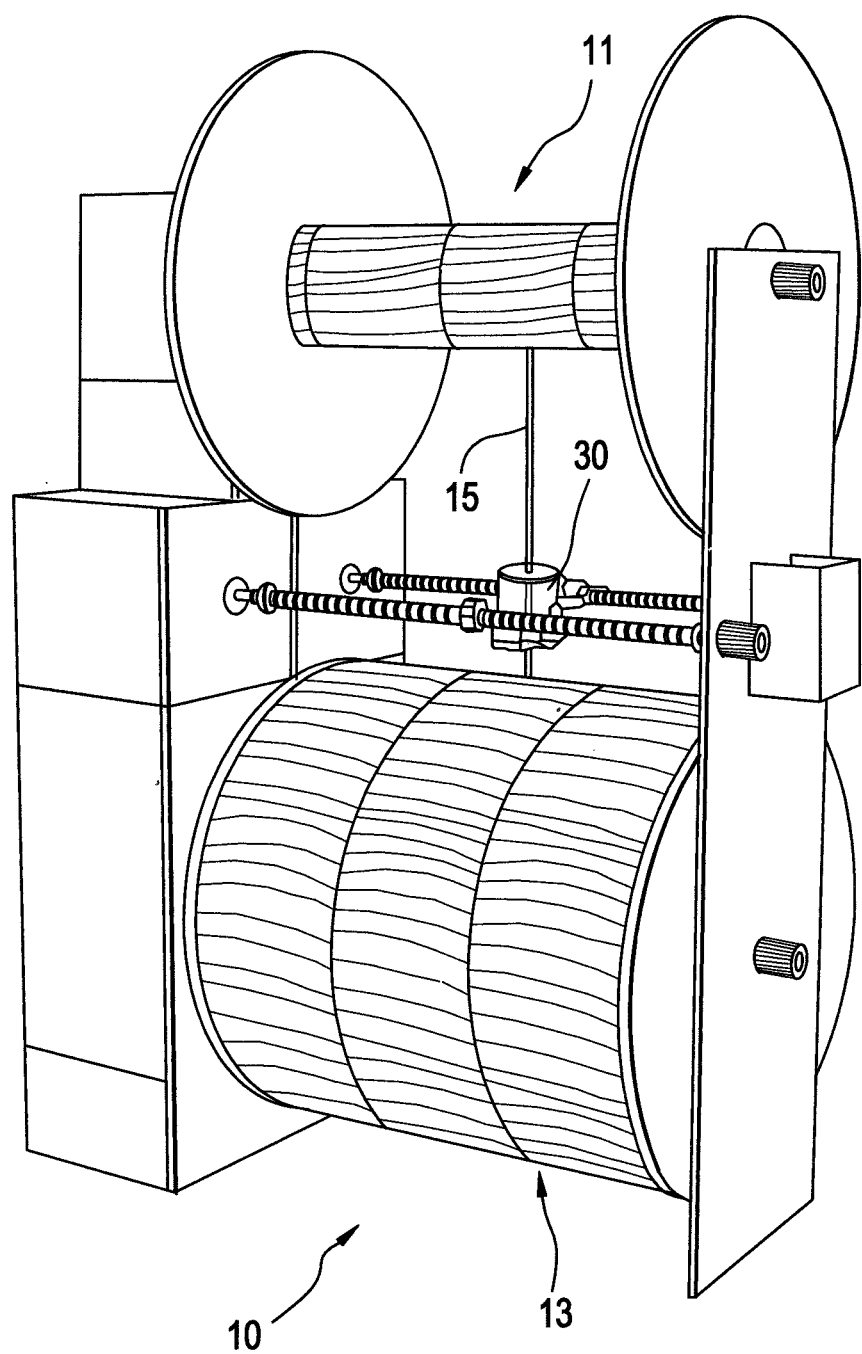
FIG. 3 shows a perspective view showing the supply and take-up reels along with other aspects of the inventive apparatus.
Figure 4:
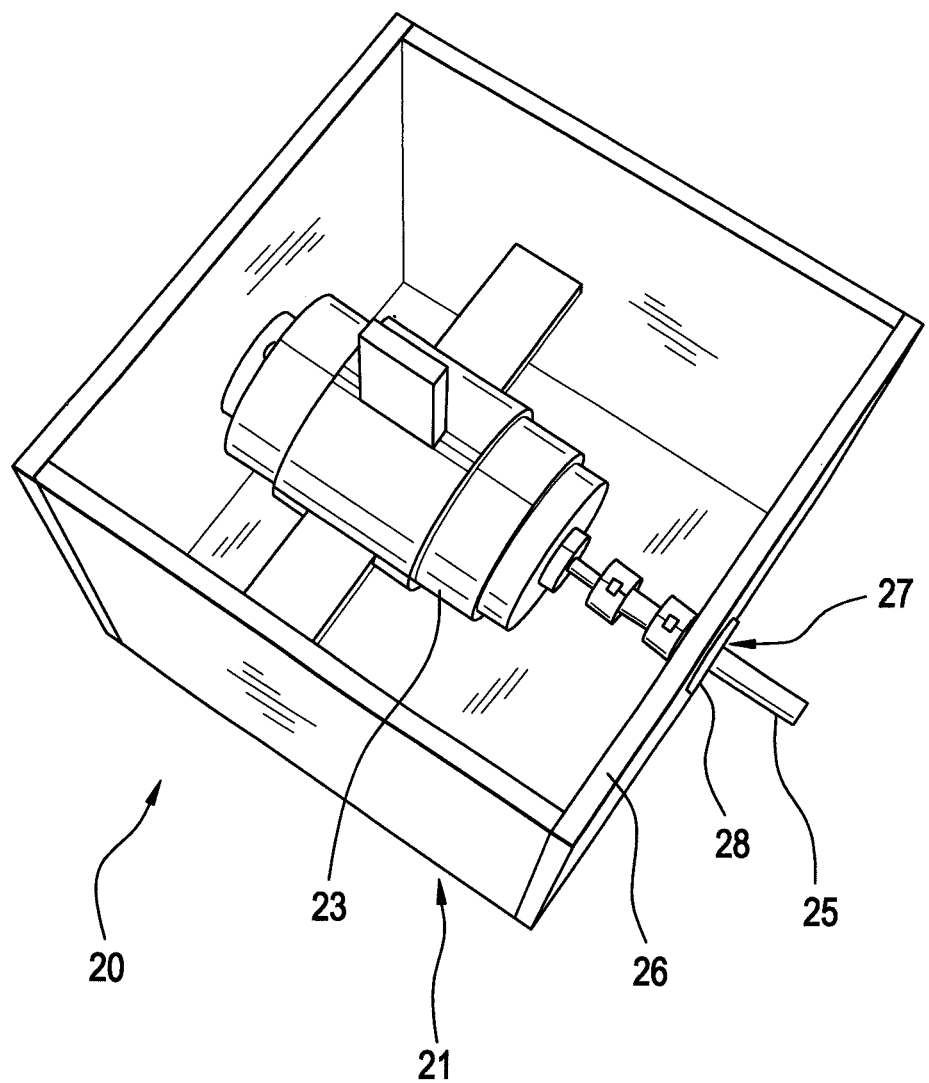
FIG. 4 shows a view within a sealed chamber where a motor used to rotate a reel is located.

Within the pressure vessel 1 a mechanism generally designated by the reference numeral 10 is seen in FIG. 7. A more comprehensive view of the mechanism 10 is also seen in FIG. 3. The mechanism 10 is seen to include a first reel 11 and a second reel 13. The reels 11 and 13 are rotatable to convey a copper wire 15 which is initially held on the reel 11 through the mechanism and onto the reel 13. With reference to FIG. 4, one of the mechanisms 20 for turning the reels 11, 13 is shown. That mechanism includes a container 21 that is sealed shut with a lid not shown in FIG. 4 and which includes a motor 23 with a drive shaft 25 that extends through a sealed opening 27 in the wall 26 of the container 21 with the drive shaft 25 being coupled to one or the other of the reels 11, 13 to allow it to be controllably rotated. The seal 28 precludes leakage of DMF into the container 21. The container 21 is hermetically sealed because, as shown in FIG. 7, it will be immersed within the pressure vessel 1 and will not properly operate if the DMF and $CO_2$ within the chamber 5 of the pressure vessel 1 can leak within the container 21.

Figure 1:
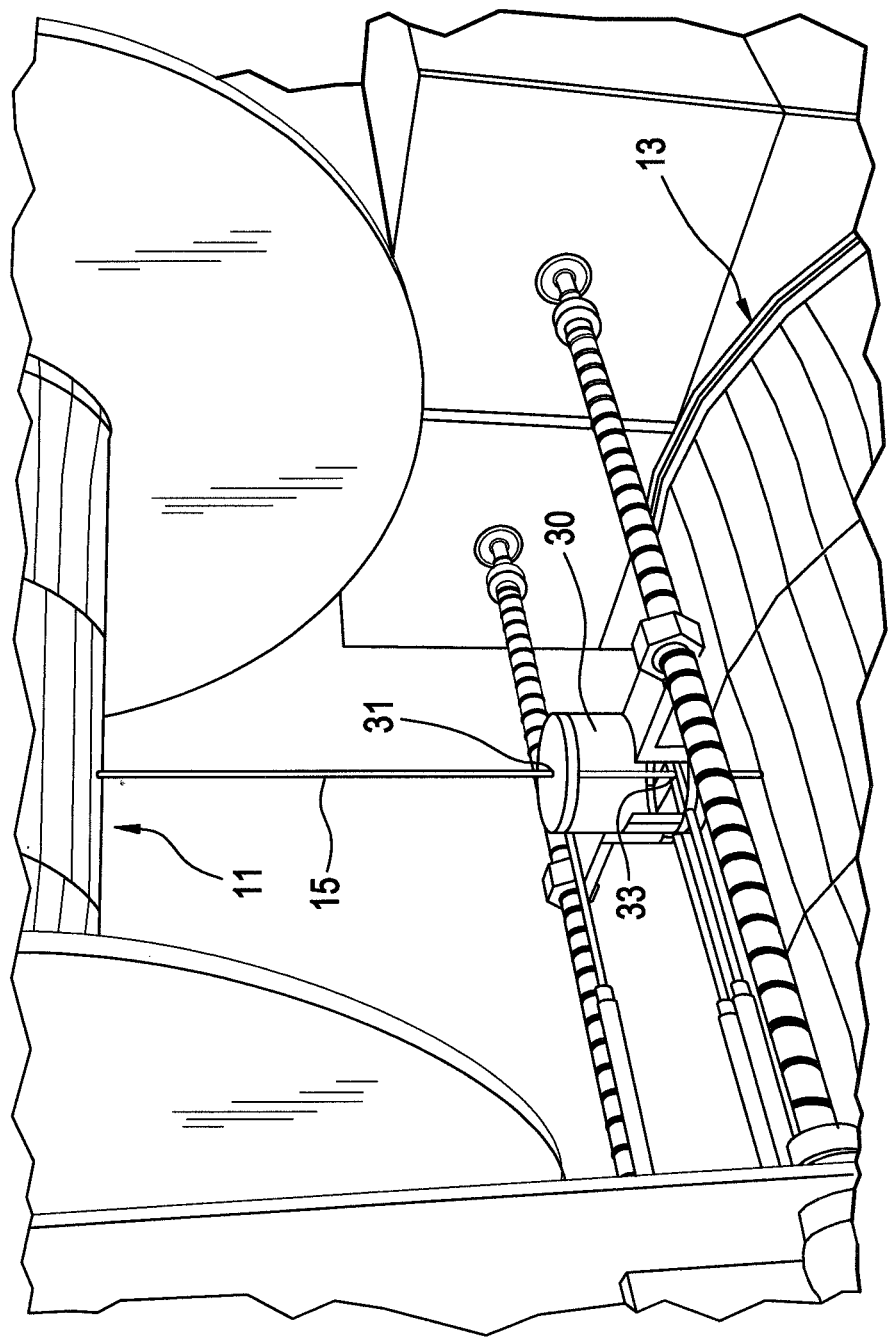
FIG. 1 shows a close-up perspective view of main portions of the inventive apparatus.
Figure 2:
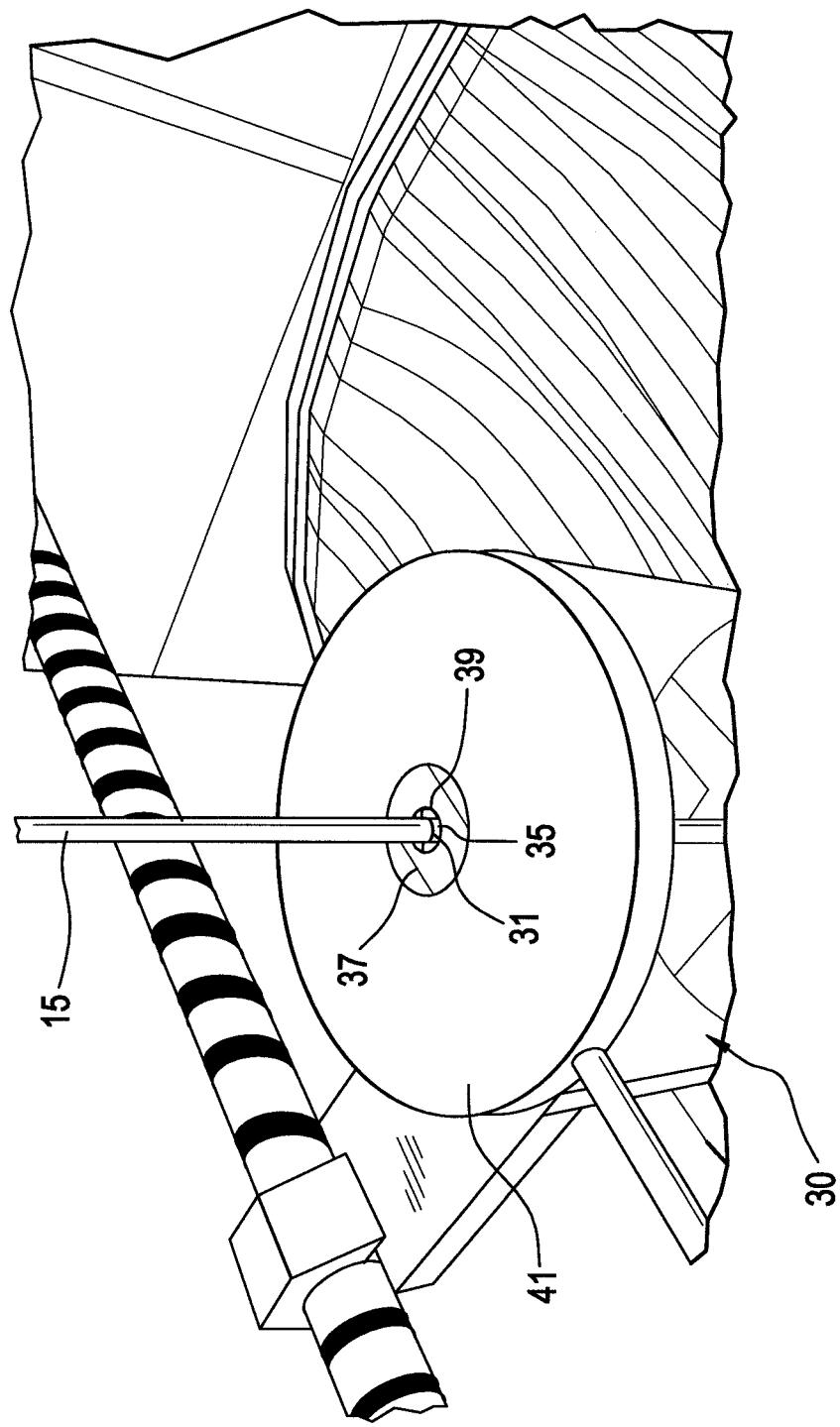
FIG. 2 shows a close-up perspective view showing a copper wire entering the processing chamber.

With reference to FIGS. 1 and 2, specific details of the inventive mechanism 10 are shown. As shown in FIGS. 1 and 2, the reel 11 is conveying the wire 15 into a container 30 via an upper opening 31. There is also a lower opening 33 at the bottom of the container 30 that allows the wire 15 to be conveyed to the reel 13 where it is taken up after having passed through the container 30.

The opening 31 defines a gap 35. The graphite electrode 41 and Galinstan-Cerium electrode 37 comprise, together, a cathode. A glass straightener 39 keeps the wire 15, comprising the anode, isolated from the Galinstan-Cerium cathode electrode 37 which is supplied current through the graphite electrode 41. The graphite electrode 41 surrounds the Galinstan-Cerium electrode 37 which surrounds the glass straightener 39 which surrounds the gap 35. GALINSTAN® is a federally registered trademark, Registration No. 2,234,783 registered by Geraberger Thermometerwerk GMBH. This mark refers to a eutectic mixture disclosed in U.S. Pat. No. 5,800,060 to Speckbrock et al, and consisting of 68-69% by weight gallium, 21-22% by weight indium and 9.5-10.5% by weight tin. See column 2, lines 66-67.

As the wire 15 travels into the container 30 with electrical power supplied to the cathode 37, 41, a chemical reaction is induced between the Galinstan-Cerium material 37 and the $CO_2$ saturated DMF liquid, and graphene is formed as a result, about the circumference of the wire 15 which adheres to the nearest point on the wire 15 through capillary action. The wire 15 is moved through the chamber 30 at a rate which facilitates always presenting a fresh surface on the wire 15 for adherence of graphene to its outer surface.

Figure 5:
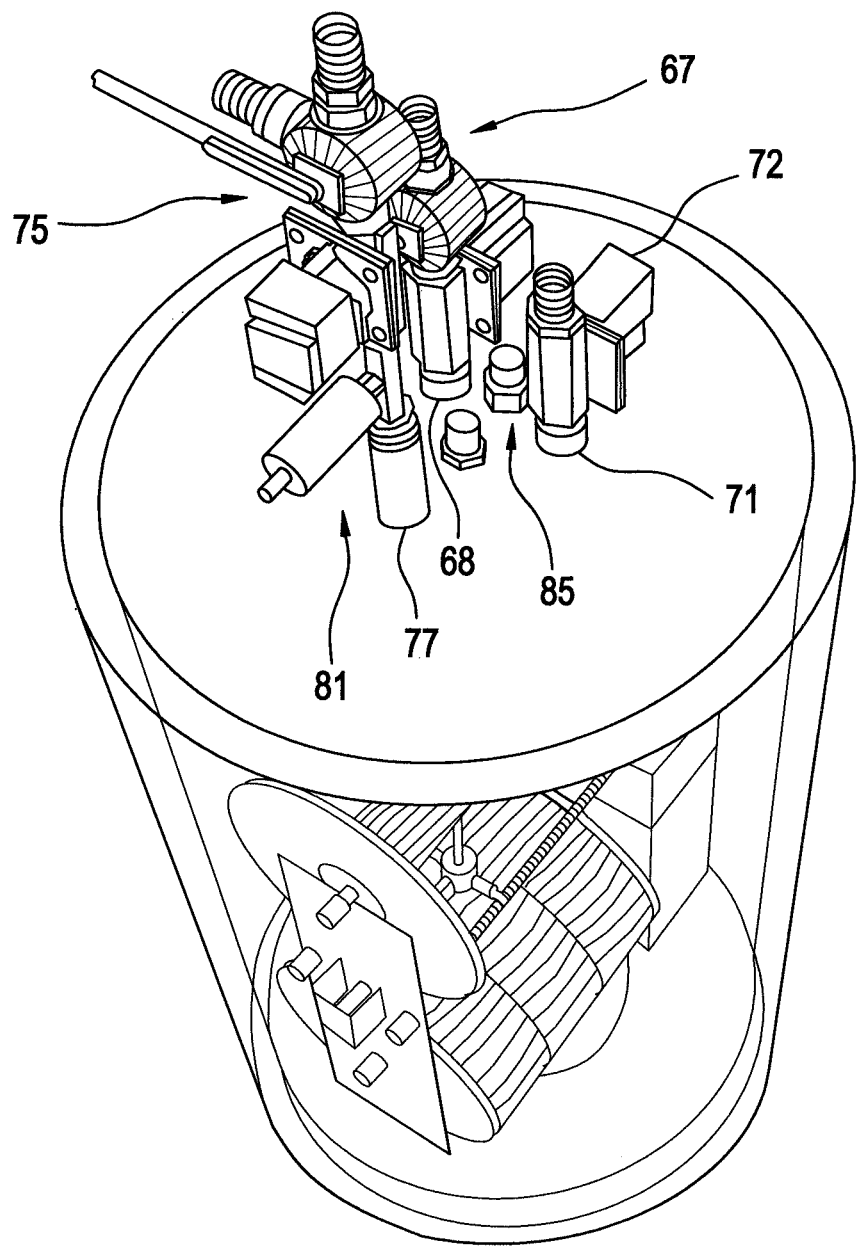
FIG. 5 shows a top perspective view of the apparatus showing various valves for supplying and exhausting substances used in practicing the inventive method.
Figure 6:
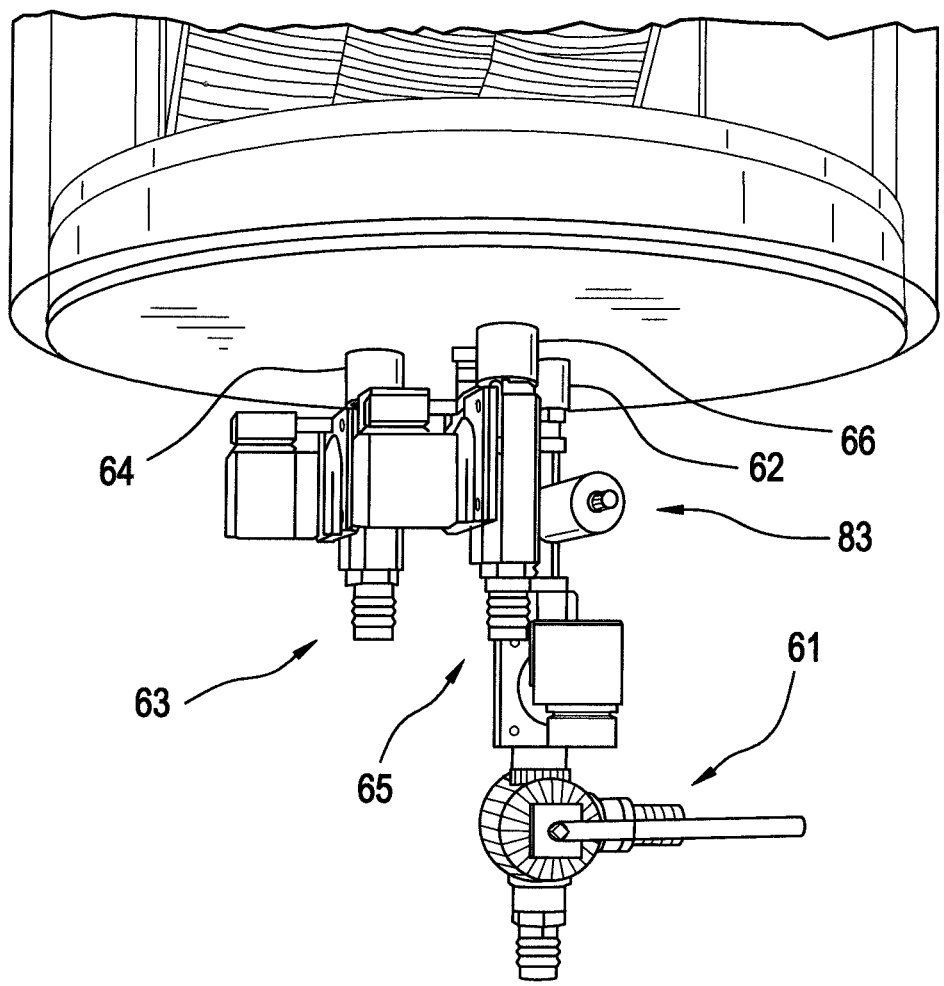
FIG. 6 shows a view similar to FIG. 5 but inverted to show additional details of the valve components.

With reference to the figures, the subject apparatus operates submerged in DMF inside the pressure vessel 2. With reference to FIGS. 5 and 6, the various ports and valves are explained in more detail.

With reference to FIG. 6, the valve 61 controls supply of $CO_2$ gas via the port 62. The valve 63 controls removal of DMF via the port 64. The valve 65 controls replacement of DMF via the port 66.

With reference to FIG. 5, gas is exhausted under control of the valve 67 via the port 68. In an emergency, gas can be exhausted via the port 71 as controlled by the valve 72. The valve 75 allows flushing of the pressure vessel 2 via the port 77. Such flushing employs either natural air or argon (which is an inert gas) with such flushing occurring between operations.

Sensors 81 (FIG. 5) and 83 (FIG. 6) monitor the pressure within the chamber 2. Electrical power is supplied within the chamber 2 via a sealed port 85 shown in FIG. 5. Various electrodes that extend through the port 85 are not shown in detail but supply the graphite cathode electrode 41 and Galinstan-Cerium cathode electrode 37 with electrical current.

The valves 61 and 67 are manipulated to maintain constant pressure, saturation, and purity of the $CO_2$ within the chamber 5 of the pressure vessel 2. Exhaust gases which are removed via the gas exhaust 67 can later be subjected to cryogenic fractional pressure distillation for purification into feedstock (pure $CO_2$ gas) and an industrially and environmentally useful gas (oxygen-$O_2$) and industrially useful chemical feedstock.

In the example of the present invention shown in FIGS. 1-7, the substrate comprises the wire 15. If desired, a larger pressure vessel can be employed for moving the electrode into axes relative to the anode and the same effect would occur but with a different morphology of deposition.

From the above description, the method of practicing the present invention should be self-evident. A copper wire 15 comprising an anode is provided on the reel 11 and is fed through the container 30 to the reel 13. Motors such as the motor 23 are operated to allow the wire 15 to be conveyed from the reel 11 to the reel 13. With the entire device within the pressurized container 2 and electrical power provided, as explained above, as the wire 15 acting as an anode is conveyed through the gap 35, current supplied to the cathode 37, 41 arrives at the gap 31 and a chemical reaction is induced between the Galinstan-Cerium material 37 and the $CO_2$ saturated DMF liquid and graphene is, as a result, deposited onto the outer surfaces of the wire 15 by capillary action and the graphene coated wire 15 is then taken up by the reel 13. The graphene coated wire may be used for any of the purposes of the present invention as described above.

The present invention has been disclosed in terms of a preferred embodiment in which a copper wire is conveyed from a first reel to a second reel and between the reels, the mechanism of the present invention coats the wire with a graphene coating. Other substrates can also be coated with graphene in manners similar to that which is disclosed herein. For example, the Galinstan electrode can be moved on an X-Y axis to print graphene onto a substrate surface such as a PC board, knife edge, ball bearing, or any other metal surface on which a graphene coating would benefit the functionality of the related product due to one or more of the superior qualities of graphene.

As such, an invention has been disclosed in terms of preferred embodiments thereof, which fulfill each and every one of the objects of the invention as set forth hereinabove, and provide a new and useful apparatus for deposition of graphene upon a metal substrate and the method for doing so of great novelty and utility.

Of course, various changes, modifications, and alterations in the teachings of the present invention may be contemplated by those skilled in the art without departing from the intended spirit and scope thereof.

As such, it is intended that the present invention only be limited by the terms of the appended claims.

The invention claimed is:

1. An apparatus for depositing graphene onto an electrically conductive wire, comprising:
   a) a sealed chamber containing pressurized $CO_2$ gas saturated Dimethylformamide (DMF);
   b) a container within said chamber having a top comprising a cathode and said container having upper and lower openings;
   c) said cathode including a first portion made of material composed of an alloy that is liquid at room temperature and comprises a mixture of 68-69% by weight gallium, 21-22% by weight indium and 9.5-10.5% by weight Tin, said alloy mixed with Cerium to serve as an electrode, and a second portion made of graphite and surrounding said first portion;
   d) a wire comprising an anode and conveyable through said container into said upper opening and through said lower opening;
   e) a source of electrical power connected to said cathode and, when activated, conveying electrical current through said cathode;
   f) a gap between said cathode and said wire;
   g) whereby, with said source of electrical power activated, as said wire is conveyed into said upper opening and through said lower opening through said container, a chemical reaction between said cathode and said DMF and CO$_2$ causes graphene to be deposited onto an outer surface of said wire.

2. The apparatus of claim 1, wherein said first portion of said cathode surrounds said gap.

3. The apparatus of claim 1, further including a first reel within said sealed chamber above said upper opening and a second reel within said chamber below said lower opening, said first reel having a supply of said wire wound thereon and said second reel being rotated to wind said wire onto said second reel after said wire has been coated with graphene.

4. The apparatus of claim 3, wherein a first motor rotates said first reel in a direction unwinding said wire from said first reel and a second motor rotates said second reel in a direction winding said wire onto said second reel.

5. The apparatus of claim 4, wherein said first and second motors are sealed within respective motor chambers within said chamber.

6. The apparatus of claim 1, wherein said CO$_2$ gas within said chamber is maintained under a positive pressure.

7. The apparatus of claim 1, wherein said chamber has valved ports for supplying and exhausting DMF into and from said chamber.

8. The apparatus of claim 1, wherein said chamber has valved ports for supplying and exhausting pressurized CO$_2$ gas into and from said chamber.

9. The apparatus of claim 2, wherein a glass straightener is provided between said Galinstan-Cerium material and said gap.

10. The apparatus of claim 4, wherein a first drive shaft connects said first motor to said first reel.

11. The apparatus of claim 10, wherein a second drive shaft connects said second motor to said second reel.

12. The apparatus of claim 1, wherein said wire is made of copper.

13. The apparatus of claim 6, wherein a pressure sensor monitors CO$_2$ pressure within said chamber.

14. An apparatus for depositing graphene onto an electrically conductive wire, comprising:
   a) a sealed chamber containing pressurized CO$_2$ gas saturated Dimethylformamide (DMF);
   b) a container within said chamber having a top comprising a cathode and said container having upper and lower openings;
   c) said cathode including a first portion made of graphite and a second portion made of a material composed of an alloy that is liquid at room temperature and comprises a mixture of 68-69% by weight gallium, 21-22% by weight indium and 9.5-10.5% by weight Tin, said alloy mixed with Cerium to serve as an electrode, said first portion surrounding said second portion;
   d) a copper wire comprising an anode and conveyable through said container into said upper opening and through said lower opening;
   e) a source of electrical power connected to said cathode and, when activated, conveying electrical current through said cathode;
   f) a gap between said cathode and said wire and a glass straightener between said cathode and said slight gap;
   g) whereby, with said source of electrical power activated, as said copper wire is conveyed from said upper opening through said lower opening through said container, a chemical reaction between said cathode and said DMF and CO$_2$ gas causes graphene to be deposited onto an outer surface of said wire.

15. The apparatus of claim 14, wherein said second portion of said cathode surrounds said glass straightener and said gap.

16. The apparatus of claim 14, further including a first reel within said sealed chamber above said upper opening and a second reel within said chamber below said lower opening, said first reel having a supply of said wire wound thereon and said second reel being rotated to wind said wire onto said second reel after said wire has been coated with graphene, wherein a first motor rotates said first reel in a direction unwinding said wire and a second motor rotates said second reel in a direction winding said wire onto said second reel, said first and second motors being sealed within respective motor chambers within said chamber.

17. An apparatus for depositing graphene onto an electrically conductive substrate, comprising:
   a) a sealed chamber containing pressurized CO$_2$ gas saturated Dimethylformamide (DMF) liquid;
   c) said cathode including at least a first portion made of graphite and a second portion made of a material composed of an alloy that is liquid at room temperature and comprises
   a mixture of 68-69% by weight gallium, 21-22% by weight indium and 9.5-10.5% by weight Tin, said alloy mixed with Cerium to serve as an electrode;
   d) said substrate comprising an anode;
   e) said source of electrical power, when activated, conveying electrical current through said cathode;
   f) a gap between said cathode and said substrate;
   g) whereby, with said source of electrical power activated, a chemical reaction is induced between the material of said second portion and said CO$_2$ saturated DMF liquid resulting in graphene being deposited onto an outer surface of said substrate.

\* \* \* \* \*